United States Patent
Hayashi et al.

(10) Patent No.: US 10,426,044 B2
(45) Date of Patent: Sep. 24, 2019

(54) THERMOSETTING ADHESIVE SHEET, REINFORCEMENT-PART-EQUIPPED FLEXIBLE PRINTED CIRCUIT, METHOD FOR MANUFACTURING REINFORCEMENT-PART-EQUIPPED FLEXIBLE PRINTED CIRCUIT, AND ELECTRONIC DEVICE

(71) Applicant: DIC Corporation, Tokyo (JP)

(72) Inventors: Koji Hayashi, Ichihara (JP); Sumio Shimooka, Kitaadachi-gun (JP); Shota Tanii, Kitaadachi-gun (JP); Akinori Morino, Kitaadachi-gun (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 15/778,369

(22) PCT Filed: Dec. 6, 2016

(86) PCT No.: PCT/JP2016/086166
§ 371 (c)(1),
(2) Date: May 23, 2018

(87) PCT Pub. No.: WO2017/104479
PCT Pub. Date: Jun. 22, 2017

(65) Prior Publication Data
US 2018/0352660 A1 Dec. 6, 2018

(30) Foreign Application Priority Data

Dec. 18, 2015 (JP) ................. 2015-247331
Jan. 6, 2016 (JP) ................. 2016-001069

(51) Int. Cl.
| | | |
|---|---|---|
| H01K 1/02 | (2006.01) | |
| H01K 1/18 | (2006.01) | |
| H01K 3/00 | (2006.01) | |
| H01K 3/24 | (2006.01) | |
| H01K 3/32 | (2006.01) | |
| H01L 21/02 | (2006.01) | |
| H01L 23/48 | (2006.01) | |
| H05K 3/38 | (2006.01) | |
| C09J 201/00 | (2006.01) | |
| C09J 7/35 | (2018.01) | |
| C09J 7/25 | (2018.01) | |
| C09J 7/28 | (2018.01) | |
| C09J 7/21 | (2018.01) | |
| C09J 7/20 | (2018.01) | |

(Continued)

(52) U.S. Cl.
CPC ........... *H05K 3/386* (2013.01); *C09J 5/06* (2013.01); *C09J 7/205* (2018.01); *C09J 7/21* (2018.01); *C09J 7/255* (2018.01); *C09J 7/28* (2018.01); *C09J 7/35* (2018.01); *C09J 9/02* (2013.01); *C09J 11/04* (2013.01); *C09J 201/00* (2013.01); *H05K 1/028* (2013.01); *H05K 1/0281* (2013.01); *H05K 3/4644* (2013.01); *C08K 2201/001* (2013.01); *C09J 2201/602* (2013.01); *C09J 2203/326* (2013.01); *C09J 2205/102* (2013.01); *C09J 2205/106* (2013.01); *C09J 2400/16* (2013.01); *C09J 2400/163* (2013.01); *C09J 2463/00* (2013.01); *C09J 2467/005* (2013.01); *C09J 2467/006* (2013.01); *H05K 3/0058* (2013.01); *H05K 2203/1105* (2013.01)

(58) Field of Classification Search
CPC .. H05K 1/02; H05K 1/03; H05K 1/05; H05K 1/09; H05K 1/11; H05K 1/18; H05K 3/00; H05K 3/24; H05K 3/32; H05K 3/36; H05K 3/44; H01L 21/02; H01L 21/50; H01L 23/31; H01L 23/48; H01L 23/498
USPC ......... 174/254–257, 251, 261; 257/680, 693, 257/738, 778, 779; 428/34.1, 343, 421, 428/432, 473.5
See application file for complete search history.

(56) References Cited

U.S. PATENT DOCUMENTS

| | | | | |
|---|---|---|---|---|
| 4,634,631 A | * | 1/1987 | Gazit | ............... B32B 15/08 428/421 |
| 4,647,508 A | * | 3/1987 | Gazit | ............... B32B 15/08 428/421 |

(Continued)

FOREIGN PATENT DOCUMENTS

| | | |
|---|---|---|
| JP | 2000-261107 A | 9/2000 |
| JP | 2005-57097 A | 3/2005 |

(Continued)

OTHER PUBLICATIONS

International Search Report dated Feb. 21, 2017, issued in counterpart application No. PCT/JP2016/086166. (2 pages).

*Primary Examiner* — Xiaoliang Chen
(74) *Attorney, Agent, or Firm* — Westerman, Hattori, Daniels & Adrian, LLP

(57) ABSTRACT

An object of the present invention relates to a thermosetting adhesive sheet that, without the use of a metal reinforcement sheet, which is regarded as a major factor responsible for an increase in thickness of electronic devices and other devices, reinforces a flexible printed circuit to such a level that detachment of mounted components, for example, is prevented, prevents warping, and has good electrical conductivity. The present invention relates to a thermosetting adhesive sheet configured to be used to reinforce a flexible printed circuit. The thermosetting adhesive sheet includes a woven fabric, a nonwoven fabric, or a metal base of 50 μm or less thickness and a thermosetting adhesive layer adjacent to at least one surface of the woven fabric, the nonwoven fabric, or the metal base of 50 μm or less thickness.

9 Claims, No Drawings

(51) Int. Cl.
  *C09J 5/06* (2006.01)
  *C09J 11/04* (2006.01)
  *H05K 1/02* (2006.01)
  *H05K 3/46* (2006.01)
  *C09J 9/02* (2006.01)
  *H05K 3/00* (2006.01)

(56) References Cited

U.S. PATENT DOCUMENTS

| | | | | |
|---|---|---|---|---|
| 5,103,293 A * | 4/1992 | Bonafino | | H01L 23/145 174/256 |
| 5,663,530 A * | 9/1997 | Schueller | | H01L 23/13 174/254 |
| 5,844,168 A * | 12/1998 | Schueller | | H01L 23/13 174/558 |
| 6,140,707 A * | 10/2000 | Plepys | | H01L 21/50 257/668 |
| 6,172,666 B1 * | 1/2001 | Okura | | H01H 13/702 200/5 A |
| 6,185,108 B1 * | 2/2001 | Okura | | H01H 13/702 174/377 |
| 6,280,828 B1 * | 8/2001 | Nakatsuka | | H01L 23/4985 174/254 |
| 6,462,274 B1 * | 10/2002 | Shim | | H01L 21/561 174/535 |
| 2001/0052647 A1 * | 12/2001 | Plepys | | H01L 21/50 257/738 |
| 2003/0042042 A1 * | 3/2003 | Jo | | B32B 7/00 174/254 |
| 2004/0246626 A1 * | 12/2004 | Wakaki | | G11B 5/486 360/245.8 |
| 2006/0154095 A1 * | 7/2006 | Matsumoto | | B32B 27/36 428/480 |
| 2007/0254117 A1 * | 11/2007 | Graydon | | H05K 1/118 428/34.1 |
| 2007/0281142 A1 * | 12/2007 | Ohta | | C08F 255/00 428/209 |
| 2010/0231840 A1 * | 9/2010 | Saida | | G02F 1/1333 349/153 |
| 2010/0327737 A1 * | 12/2010 | Hayashi | | B64D 47/02 313/504 |
| 2013/0176746 A1 * | 7/2013 | Nishimura | | H05K 1/189 362/382 |
| 2014/0048314 A1 * | 2/2014 | Kido | | H05K 1/0281 174/254 |
| 2015/0027754 A1 * | 1/2015 | Shimoda | | B32B 27/281 174/251 |
| 2015/0251397 A1 * | 9/2015 | Lee | | B32B 15/08 428/141 |
| 2015/0257253 A1 * | 9/2015 | Lee | | H05K 1/028 428/40.9 |
| 2016/0007444 A1 * | 1/2016 | Watanabe | | H05K 1/0215 174/254 |
| 2016/0073495 A1 * | 3/2016 | Happoya | | H05K 1/0281 174/254 |
| 2017/0290145 A1 * | 10/2017 | Tajima | | H05K 1/02 |

FOREIGN PATENT DOCUMENTS

| | | |
|---|---|---|
| JP | 2006-339173 A | 12/2006 |
| JP | 2009-200292 A | 9/2009 |
| JP | 2009-218443 A | 9/2009 |
| WO | 2014/132951 A1 | 9/2014 |

* cited by examiner

THERMOSETTING ADHESIVE SHEET, REINFORCEMENT-PART-EQUIPPED FLEXIBLE PRINTED CIRCUIT, METHOD FOR MANUFACTURING REINFORCEMENT-PART-EQUIPPED FLEXIBLE PRINTED CIRCUIT, AND ELECTRONIC DEVICE

TECHNICAL FIELD

The present invention relates to a thermosetting adhesive sheet that may be used to form a reinforcement part that is provided to prevent, for example, detachment of components mounted on a flexible printed circuit.

BACKGROUND ART

As portable electronic terminals and other devices are becoming smaller and thinner, thin and bendable flexible printed circuits are being widely used as circuits installed in such devices.

Known flexible printed circuits, in general, include those having a structure in which a ground circuit made of, for example, copper is formed on a surface of, for example, a polyimide film and components, such as connectors, are mounted on a portion of the circuit.

In many cases, such flexible printed circuits typically include a metal reinforcement sheet attached to the back surface, opposite to the mounting surface, via, for example, an electrically conductive adhesive in order to prevent connection failure when mounting components and to prevent the components from becoming detached over time. Such a metal reinforcement sheet may be made of, for example, a stainless steel sheet and have a thickness of more than 50 µm (see, for example, Patent Literature 1).

In the case that such a thick reinforcement sheet is provided, however, the flexible printed circuit and an electronic device in which the flexible printed circuit is installed are inevitably thick. Thus, there are cases in which it is impossible to contribute to a thickness reduction of electronic devices and other devices, which is desired in the industry.

In view of contributing to such a thickness reduction, when only an electrically conductive adhesive is used without using a thick metal reinforcement sheet, there are cases in which warping of the flexible printed circuit occurs as a result of shrinkage during curing of the electrically conductive adhesive.

On the other hand, for flexible printed circuits, there is a known method for preventing the generation of noise due to the influence of electromagnetic waves. In the method, the ground circuit and other members are electrically connected to each other by using electrically conductive tape (see, for example, Patent Literature 1).

However, in the circumstance in which a thickness reduction of electronic devices and other devices and a higher level of electrical conductivity are desired, there are cases in which the use of only an electrically conductive adhesive, without the use of a thick metal reinforcement sheet, results in a level of electrical conductivity slightly below the level of electrical conductivity desired in the industry, which results in a failure to exhibit good electromagnetic wave shielding characteristics.

CITATION LIST

Patent Literature

PTL 1: Pamphlet of International Publication No. 2014/132951

SUMMARY OF INVENTION

Technical Problem

An object of the present invention is to provide a thermosetting adhesive sheet that, without the use of a thick metal reinforcement sheet, which is regarded as a major factor responsible for an increase in thickness of electronic devices and other devices, reinforces a flexible printed circuit to such a level that detachment of mounted components, for example, is prevented, inhibits warping that may occur due to thermal curing, and has good electrical conductivity.

Solution to Problem

The present inventors achieved the object through a thermosetting adhesive sheet configured to be used to reinforce a flexible printed circuit. The thermosetting adhesive sheet includes a woven fabric, a nonwoven fabric, or a metal base of 50 µm or less thickness and a thermosetting adhesive layer adjacent to at least one surface of the woven fabric, the nonwoven fabric, or the metal base of 50 µm or less thickness.

Advantageous Effects of Invention

The thermosetting adhesive sheet of the present invention is capable of forming a reinforcement part, without the use of a thick metal reinforcement sheet, which is regarded as a major factor responsible for an increase in thickness of electronic devices and other devices, that reinforces the mechanical strength of a flexible printed circuit to such a level that detachment of mounted components, for example, is prevented, inhibits warping of the flexible printed circuit, and has electrical conductivity at a level that enables electromagnetic wave shielding characteristics sufficient for practical use to be exhibited. Thus, the thermosetting adhesive sheet can contribute significantly to a thickness reduction of reinforcement sheet-equipped flexible printed circuits, electronic devices, and other devices dedicatedly.

DESCRIPTION OF EMBODIMENTS

The thermosetting adhesive sheet of the present invention is configured to be used to reinforce a flexible printed circuit. The thermosetting adhesive sheet includes a woven fabric, a nonwoven fabric, or a metal base of 50 µm or less thickness and a thermosetting adhesive layer adjacent to at least one surface of the woven fabric, the nonwoven fabric, or the metal base of 50 µm or less thickness.

It is preferable that the thermosetting adhesive sheet melt when heated to a temperature of approximately 100° C. or higher and thus be able to bond (join) together two or more bonding targets.

As the base (core body) of the thermosetting adhesive sheet, a woven fabric, a nonwoven fabric, or a metal base of 50 µm or less thickness is used. This makes it possible to achieve both inhibition of warping due to shrinkage during thermal curing and excellent electrical conductivity.

Examples of the woven fabric or the nonwoven fabric include those obtained by subjecting a woven fabric or a nonwoven fabric known in the art to an electrically conductive treatment. The woven fabric or the nonwoven fabric, which may be used herein, may be a woven fabric or a nonwoven fabric known in the art or a fabric generally known as an electrically conductive woven fabric or an electrically conductive nonwoven fabric. Preferably, the woven fabric or the nonwoven fabric, which may be used herein, may be an electrically conductive woven fabric or an electrically conductive nonwoven fabric so that even higher electrical conductivity can be imparted.

It is preferable that the woven fabric or the nonwoven fabric, which may be used herein, have a basis weight of 3 to 30 g/cm$^2$. Preferably, the woven fabric or the nonwoven fabric, which may be used herein, may have a basis weight of 4 to 20 g/cm$^2$ so that the thermosetting adhesive layer can be impregnated into the woven fabric or the nonwoven fabric during thermal curing of the electrically conductive adhesive sheet to impart even higher electrical conductivity.

Examples of the woven fabric or the nonwoven fabric, which may be used herein, include woven fabrics and nonwoven fabrics made of one or more of the following: silk, wool, cotton, hemp, asbestos, rayon fibers, acetate fibers, polyamide fibers, polyvinyl alcohol fibers, acrylic fibers, polyester fibers, polyvinylidene chloride fibers, polyvinyl chloride fibers, polyurethane fibers, polyethylene fibers, and polypropylene fibers.

It is preferable that the woven fabric or the nonwoven fabric, which may be used herein, be made of, for example, polyamide fibers or polyester fibers because such fabrics can be used in high-temperature environments for mounting components and so that the thermosetting adhesive sheet can be reduced in thickness, warping can be inhibited, and a thermosetting adhesive sheet having even higher electrical conductivity can be obtained. More preferably, the woven fabric or the nonwoven fabric, which may be used herein, may be made of polyester fibers, and even more preferably, the woven fabric or the nonwoven fabric, which may be used herein, may be made of wet-laid polyester fibers.

The electrically conductive woven fabric or the electrically conductive nonwoven fabric, which may be used herein, may be obtained by subjecting the above-described woven fabric or nonwoven fabric to an electrically conductive treatment.

Examples of the electrically conductive treatment include plating, vapor deposition, sputtering, ion plating, and coating with an electrically conductive polymer.

The electrically conductive nonwoven fabric may be obtained by subjecting the wet-laid polyester nonwoven fabric to plating including an electroless plating process. Here, the "plating including an electroless plating process" includes a process in which one or more electroless plating processes are performed, a process in which the aforementioned one or more electroless plating processes are performed and thereafter one or more electrolytic plating processes are performed, and a process in which one or more electrolytic plating processes are performed and thereafter one or more electroless plating processes are performed. In the present invention, it is preferable to perform an electroless plating process and thereafter further perform an electroless plating process or an electrolytic plating process, and it is more preferable to perform an electroless plating process and thereafter further perform an electrolytic plating process.

For example, the electroless plating process may be a process in which a wet-laid polyester nonwoven fabric, such as described above, is immersed in a liquid containing a catalyst, such as palladium, and in an electroless plating liquid containing metal ions and a reducing agent, thereby forming a metal film on the surface of the nonwoven fabric.

The electroless plating process may include, in addition to the aforementioned steps, a step of cleaning the wet-laid polyester nonwoven fabric, a step of activating the catalyst, and a step of rinsing with water or drying the wet-laid polyester nonwoven fabric and the plated nonwoven fabric.

A preferable method for performing the electroless plating process may be a method including cleaning the wet-laid polyester nonwoven fabric base, performing rinsing with water, thereafter catalyzing the wet-laid polyester nonwoven fabric, performing rinsing with water, activating the catalyst, performing rinsing with water, immersing the wet-laid polyester nonwoven fabric in an electroless plating liquid, and performing rinsing with water and drying.

The metal ions included in the electroless plating liquid may be ions of, for example, copper, nickel, silver, platinum, or aluminum, and it is preferable to use at least one of copper ions and nickel ions in order to achieve even higher electrical conductivity and low cost, and it is more preferable to use copper ions in order to impart even higher adhesion.

More specifically, it is preferable that the electrically conductive woven fabric or the electrically conductive nonwoven fabric for use in the present invention, which may be used herein, be a fabric obtained by subjecting a wet-laid polyester nonwoven fabric to an electroless metal plating process and thereafter further to an electroless plating process or an electrolytic plating process. In particular, after the electroless metal plating process, it is preferable that the electrically conductive woven fabric or the electrically conductive nonwoven fabric, which may be used herein, be a fabric subjected to an electrolytic plating process because such a plating layer can be formed stably in a relatively short time, which increases manufacturing efficiency, and also a strength increase can be achieved.

Examples of electrolytic liquids that may be used in the electrolytic process include: copper plating liquids including, for example, copper pyrophosphate bath, a copper cyanide bath, or a copper sulphate bath; nickel plating liquids including, for example, a Watts bath, a chloride bath, or a sulfamic acid bath; chrome plating liquids including, for example, a Sargent bath; and plating liquids including, for example, gold, silver, tin, or zinc.

It is preferable that the electrically conductive woven fabric or the electrically conductive nonwoven fabric, which may be used herein, have an outermost layer formed of a plating layer including nickel because such a fabric has excellent preservation stability, excellent adhesion between the wet-laid polyester nonwoven fabric and the plating layer, and excellent electrical conductivity.

Examples of preferable forms of the electrically conductive woven fabric or the electrically conductive nonwoven fabric include electrically conductive bases obtained by subjecting a wet-laid polyester nonwoven fabric to an electroless copper plating process and an electrolytic nickel plating process in the order stated and electrically conductive bases obtained by subjecting a wet-laid polyester-based nonwoven fabric to an electroless copper plating process, an electrolytic copper plating process, and an electrolytic nickel plating process in the order stated.

It is preferable that the woven fabric or the nonwoven fabric, which may be used herein, have a thickness of 10 μm to 50 μm. More preferably, the woven fabric or the nonwoven fabric, which may be used herein, may have a thickness of 10 μm to 30 μm so that the thermosetting adhesive sheet can be reduced in thickness, warping can be inhibited, and a thermosetting adhesive sheet having even higher electrical conductivity can be obtained. In addition, the use of a woven fabric or a nonwoven fabric having a thickness in the above-mentioned range is preferable so that, when the thermosetting adhesive sheet is taken up on a roll, fractures and cracks, for example, can be avoided and thus excellent flexibility is exhibited.

The metal base of 50 μm or less thickness, which may be used herein, may be a thin metal base having a thickness of 50 μm or less. This makes it possible to obtain the thermosetting adhesive sheet, which achieves a thickness reduction of the thermosetting adhesive sheet, inhibits warping, and has even higher electrical conductivity. In addition, when the thermosetting adhesive sheet is taken up on a roll, fractures and cracks, for example, can be avoided and thus excellent flexibility is exhibited, which is preferable.

The metal base, which may be used herein, may preferably have a thickness of 5 μm to 50 μm, more preferably have a thickness of 5 μm to 25 μm, and more preferably have a thickness of 5 μm to 15 μm.

In the related art, stainless steel sheets used in reinforcement parts of flexible printed circuits typically have a thickness of more than 50 μm and are intended to reinforce the circuits by the stainless steel sheets themselves, and are thus a major factor responsible for an increase in thickness of circuits and electronic devices in which such a circuit is installed. In the present invention, the thermoset product of the thermosetting adhesive sheet has a reinforcement capability, and the woven fabric, the nonwoven fabric, or the metal base contributes to retention of good electrical conductivity and inhibition of warping, which eliminates the need to use a thick base, such as a stainless steel sheet, which is used in the related art.

Examples of the metal base, which may be used herein, include metal bases including, for example, aluminum, copper, nickel, silver, or gold.

The metal base is provided on or near the surface of the reinforcement part, which is a constituent of a reinforcement-part-equipped flexible printed circuit. The electrically conductive base may be joined by the adhesion force of the thermosetting adhesive sheet, which forms the reinforcement part, or may be joined via an additional adhesive or adhesive tape, for example.

The thermosetting adhesive sheet of the present invention, which may be used herein, may include a thermosetting adhesive layer adjacent to at least one surface of the woven fabric, the nonwoven fabric, or the metal base of 50 μm or less thickness.

The thermosetting adhesive layer may be in a state of being laid over the surface of the woven fabric or the nonwoven fabric or the thermosetting adhesive layer may be in a state of partially being impregnated into the woven fabric or the nonwoven fabric.

The thermosetting adhesive layer, which may be used herein, may preferably have a thickness in a range of 50 μm to 350 μm and preferably have a thickness of 70 μm to 300 μm. More preferably, the thermosetting adhesive layer, which may be used herein, may have a thickness of 100 μm to 200 μm so that excellent rigidity can be imparted to the set product. The thickness mentioned above is a distance from the surface of the woven fabric, the nonwoven fabric, or the metal base to the surface of the thermosetting adhesive layer and does not include the thickness of the portion where a portion of the thermosetting adhesive layer is impregnated into the woven fabric or the nonwoven fabric.

It is preferable that the thermosetting adhesive layer, which may be used herein, have, in a state before being thermoset, a tensile modulus ($\times1$) at 25° C. in a range of 50 to 2500 MPa. More preferably, the thermosetting adhesive layer, which may be used herein, may have a tensile modulus ($\times1$) at 25° C. in a range of 50 to 1000 MPa so that precise formation of a desired shape by stamping can be facilitated and thus processing into a desired shape in accordance with the shape of the portion, in a flexible printed circuit, that needs to be reinforced, can be facilitated, and also so that the follow of the surface contour of the portion can be facilitated to achieve excellent adhesion, the portion can be reinforced more effectively, processing into a sheet shape can be facilitated, as will be described later, and, when the sheet is taken up on a roll, the occurrence of cracks, for example, can be inhibited.

On the other hand, in the case that a reinforcement part that provides even higher reinforcement performance is desired to be formed, the thermosetting adhesive layer, which may be used herein, may have a tensile modulus ($\times1$) at 25° C. in a range of more than 1000 to less than 2500 MPa.

Furthermore, it is preferable that the thermosetting adhesive layer, which may be used herein, have a tensile modulus ($\times1$) in the aforementioned range and also have a tensile modulus ($\times2$) at 25° C. of the thermoset product thereof of 2500 MPa or more so that rigidity of a level that achieves more effective support and reinforcement of a flexible printed circuit can be achieved even in the case that a thick metal reinforcement sheet is not used as opposed to cases in the related art.

It is more preferable that the thermosetting adhesive layer, which may be used herein, have a tensile modulus ($\times2$) at 25° C. after thermosetting in a range of 3000 MPa or more. More preferably, the thermosetting adhesive layer, which may be used herein, may have a tensile modulus ($\times2$) at 25° C. after thermosetting in a range of 4000 MPa or more so that both a sufficient level of reinforcement for practical use of a flexible printed circuit and a thickness reduction of the reinforcement-part-equipped flexible printed circuit can be achieved. The upper limit of the tensile modulus ($\times2$) is not particularly limited, but is preferably 10000 MPa or less and more preferably 7000 MPa or less.

Here, the tensile modulus ($\times2$) is a tensile modulus at 25° C. of a thermoset product obtained by heating the thermosetting adhesive layer at 200° C. for 120 minutes.

The thermosetting adhesive layer, which may be used herein, may contain a thermosetting resin and, as necessary, an electrically conductive filler, for example.

Examples of the thermosetting resin, which may be used herein, include urethane resins, phenolic resins, unsaturated polyester resins, epoxy resins, and acrylic resins. In particular, it is preferable that the thermosetting resin, which may be used herein, be an epoxy resin because epoxy resins have rigidity of a level that achieves a stronger reinforcement of a flexible printed circuit even when a thick metal reinforcement sheet, such as in the related art, is not used and the reinforcement part is thin, epoxy resins exhibit excellent adhesion force toward the surface of the ground traces and toward polyimide in the surface of a flexible printed circuit, and epoxy resins have excellent dimensional stability to an extent that inhibits warping after thermosetting.

The epoxy resin may be used, based on the total amount of the thermosetting resin, preferably in an amount in a range of 80 mass % or more, and more preferably in an amount in a range of 90 mass % or more so that warping after thermosetting can be inhibited more effectively.

The epoxy resin, which may be used herein, may be a compound having two ore more epoxy groups per molecule. Specific examples of epoxy resins that may be used herein include bisphenol A type epoxy resins, bisphenol F type epoxy resins, biphenyl type epoxy resins, tetramethyl biphenyl type epoxy resins, polyhydroxy naphthalene type epoxy resins, isocyanate-modified epoxy resins, 10-(2,5-dihydroxyphenyl)-9,10-dihydro-9-oxa-10-phosphaphenanthrene-10-oxide modified epoxy resins, phenol novolac type epoxy resins, cresol novolac type epoxy resins, triphenylmethane type epoxy resins, tetraphenylethane type epoxy resins, dicyclopentadiene-phenol addition reaction type epoxy resins, phenol-aralkyl type epoxy resins, naphthol novolac type epoxy resins, naphthol aralkyl type epoxy resins, naphthol-phenol co-condensed novolac type epoxy resins, naphthol-cresol co-condensed novolac type epoxy resins, aromatic hydrocarbon formaldehyde resin-modified phenol resin type epoxy resins, biphenyl-modified novolac type epoxy resins, epoxy group-containing acrylic resins, and epoxy group-containing urethane resins.

In particular, it is preferable that the epoxy resin, which may be used herein, be a bisphenol A type epoxy resin, a bisphenol F type epoxy resin, a polyhydroxy naphthalene type epoxy resin, an isocyanate-modified epoxy resin, a 10-(2,5-dihydroxyphenyl)-9,10-dihydro-9-oxa-10-phosphaphenanthrene-10-oxide modified epoxy resin, or a dicyclopentadiene-phenol addition reaction type epoxy resin. The reasons are that the reinforcement part, which, without the use of a thick metal reinforcement sheet, which is regarded as a major factor responsible for an increase in thickness of electronic devices and other devices, reinforces a flexible printed circuit to such a level that detachment of mounted components, for example, is prevented can be formed, manufacturing efficiencies for reinforcement sheet-equipped flexible printed circuits, electronic devices, and other devices can be dramatically improved, and the reinforcement part, which exhibits excellent step followability toward a flexible printed circuit, can be formed.

It is preferable that the epoxy resin, which may be used herein, have a total epoxy equivalent weight in a range of 300 g/eq. to 2000 g/eq. so that warping of the reinforcement part, which is the thermoset product, can be inhibited more effectively.

The thermosetting adhesive layer, which may be used herein, may contain, in addition to the thermosetting resin, one or more additional components depending on the need. In particular, it is preferable that the thermosetting adhesive layer, which may be used herein, contain the thermosetting resin and an electrically conductive filler so that the reinforcement part, which has high electrical conductivity, can be formed.

The electrically conductive filler, which may be used herein, may be an electrically conductive material known in the art. Examples of the electrically conductive material, which may be used herein, include particles of metal, such as gold, silver, copper, nickel, stainless steel, and aluminum, particles of an electrically conductive resin including, for example, carbon or graphite, and particles having a metal-coated surface, including, for example, a resin, solid glass beads, or hollow glass beads.

It is preferable that the electrically conductive filler, which may be used herein, be particles of nickel or copper among the examples mentioned above. In particular, the electrically conductive filler, which may be used herein, may preferably be a nickel powder manufactured by the Carbonyl method or a copper powder manufactured by an electrolytic method so that a reinforcement part having even higher electrical conductivity can be formed.

Specifically, suitable examples of the electrically conductive filler, which may be used herein, include NI255 and NI287 (manufactured by INCO Limited), which are nickel powders manufactured by the Carbonyl method, and FCC-115 (manufactured by Fukuda Metal Foil & Powder Co., Ltd.), which is a copper powder manufactured by an electrolytic method.

In addition, it is more preferable that the electrically conductive filler, which may be used herein, be a combination of particles of stainless steel and particles of nickel or copper so that a decrease in the electrical conductivity, which may be caused by the formation of an oxide film on the surface of the electrically conductive filler due to the influence of heat, can be effectively inhibited, and manufacturing costs for the thermosetting adhesive sheet can be reduced. It is particularly preferable that the electrically conductive filler, which may be used herein, be a combination of particles of stainless steel and particles of nickel.

The electrically conductive filler, which may be used herein, may have a 50% volume average particle diameter of, preferably, 0.1 to 200 µm, more preferably, 1 to 100 µm, and even more preferably, 10 to 50 µm. Particularly preferably, the electrically conductive filler, which may be used herein, may have a 50% volume average particle diameter of 10 to 30 µm so that both good dispersibility of the electrically conductive filler in the thermosetting adhesive layer and ease of application of the thermosetting adhesive used to form the thermosetting adhesive layer can be achieved. The 50% volume particle diameter of the electrically conductive filler is a value measured by using a laser diffraction particle size analyzer, SALD-3000, manufactured by Shimadzu Corporation, and by using isopropanol as the dispersion medium.

In addition, it is preferable that the electrically conductive filler, which may be used herein, have an apparent density of 1.5 g/cm$^3$ or less, and it is more preferable that the electrically conductive filler, which may be used herein, have an apparent density of 0.1 g/cm$^3$ or more and 1.0 g/cm$^3$ or less, because such electrically conductive fillers are unlikely to settle to the bottom in the thermosetting adhesive and thus a relatively uniform dispersion state can be maintained over several hours. The apparent density of the electrically conductive filler is a value measured in accordance with JIS Z 2504-2000, "Metallic powders-Determination of apparent density".

In addition, the electrically conductive filler, which may be used herein, may be an electrically conductive filler surface-treated with, for example, a titanate coupling agent or an aluminate coupling agent so that dispersibility in the thermosetting adhesive can be further improved to obtain a reinforcement part having excellent electrical conductivity with low non-uniformity.

It is preferable that the electrically conductive filler be used in an amount in a range of 50 to 1000 parts by mass. More preferably, the electrically conductive filler may be used in an amount in a range of 100 to 500 parts by mass so that the thermosetting adhesive sheet, which is capable of forming a reinforcement part having adhesion and excellent electrical conductivity, can be obtained. The amounts are each an amount per 100 parts by mass of the thermosetting resin (solids).

In addition, the thermosetting adhesive layer, which may be used herein, may contain one or more additional components in addition to the electrically conductive filler. Examples of such additional components include electrically insulating fillers, such as aluminum hydroxide, aluminum oxide, aluminum nitride, magnesium hydroxide, magnesium oxide, mica, talc, boron nitride, and glass flakes.

In addition, it is preferable that the thermosetting adhesive layer, which may be used herein, contain a curing agent reactive with the thermosetting resin.

It is preferable that the curing agent, which may be used herein, contain functional groups reactive with epoxy groups, in the case that, for example, an epoxy resin is used as the thermosetting resin.

Examples of the curing agent include amine-based compounds, amide-based compounds, acid anhydride-based compounds, and phenolic-based compounds. Examples of the amine-based compound, which may be used herein, include diaminodiphenylmethane, diethylenetriamine, triethylenetetramine, diaminodiphenyl sulfone, isophoronediamine, imidazole derivatives, BF3-amine complexes, and guanidine derivatives.

Examples of the amide-based compound include dicyandiamide and polyamide resins synthesized from a dimer of linolenic acid and ethylenediamine. Examples of the acid anhydride-based compound include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of the phenolic-based compound include phenol novolac resins, cresol novolac resins, aromatic hydrocarbon formaldehyde resin-modified phenolic resins, dicyclopentadiene phenol addition type resins, phenol aralkyl resins (xylok resins), naphthol aralkyl resins, trimethylolmethane resins, tetraphenylolethane resins, naphthol novolac resins, naphthol-phenol co-condensed novolac resins, naphthol-cresol co-condensed novolac resins, biphenyl-modified phenolic resins (polyphenolic compounds in each of which phenol nuclei are bonded to each other through bismethylene groups), biphenyl-modified naphthol resins (polyhydric naphthol compounds in each of which phenolic nuclei are bonded to each other through bismethylene groups), aminotriazine-modified phenolic resins (compounds each containing a phenol backbone, a triazine ring, and a primary amino group in the molecular structure), and polyphenolic compounds such as alkoxy group-containing aromatic ring-modified novolac resins (polyphenolic compounds in each of which phenolic nuclei and alkoxy group-containing aromatic rings are bonded to each other through formaldehyde).

The curing agent may preferably be used in an amount in a range of 1 to 60 parts by mass and preferably be used in an amount in a range of 5 to 30 parts by mass. The amounts are each an amount per 100 parts by mass of the thermosetting resin, such as the epoxy resin, in total.

In addition, the thermosetting adhesive layer, which may be used herein, may contain a curing accelerator. Examples of the curing accelerator, which may be used herein, include phosphorus-containing compounds, amine compounds, and imidazole derivatives. In the case of using the curing accelerator, the amount of use may preferably be 0.1 to 5 parts by mass and more preferably be in a range of 0.5 to 3 parts by mass. The amounts are each an amount per 100 parts by mass of the thermosetting resin, such as the epoxy resin, in total.

It is preferable that the curing agent and the curing accelerator, which may be used herein, each be in the form of a powder. With a powdery curing accelerator, the thermal curing reaction is inhibited from occurring at low temperatures, compared with a liquid curing accelerator, and thus the storage stability at room temperature of the thermosetting adhesive sheet prior to thermosetting is further improved.

In addition, the thermosetting adhesive layer, which may be used herein, may contain a thermoplastic resin so that toughness can be ensured such that, even when the reinforcement part, which is formed of a thermoset product of the thermosetting adhesive sheet of the present invention, is used in an environment having large temperature variations, the reinforcement part is unlikely to be damaged, for example.

Examples of the thermoplastic resin, which may be used herein, include thermoplastic polyester resins and thermoplastic urethane resins, and in particular, the use of a thermoplastic polyester resin is preferable. Preferably, the thermoplastic resin, which may be used herein, may be a polyether ester amide resin or a polyvinylacetoacetal resin so that the thermosetting adhesive sheet capable of forming the reinforcement part, which has both good brittleness of a level such as described above and rigidity of a level that achieves sufficient reinforcement of a flexible printed circuit, can be obtained.

For the reasons described above, it is preferable that the thermoplastic resin be used in an amount in a range of 5 to 100 parts by mass per 100 parts by mass of the thermosetting resin.

The thermosetting adhesive layer may be formed from a thermosetting adhesive containing components, such as the thermosetting resin, the electrically conductive filler, and the curing agent, for example. It is preferable that the thermosetting adhesive, which may be used herein, contain a solvent in addition to the components described above so that the thermosetting adhesive layer having a preferable thickness such as described above can be formed.

Examples of the solvent, which may be used herein, include: ester-based solvents, such as methyl acetate, ethyl acetate, propyl acetate, and butyl acetate; ketone-based solvents, such as acetone, methyl ethyl ketone, methyl isobutyl ketone, diisobutyl ketone, and cyclohexanone; and aromatic hydrocarbon-based solvents, such as toluene and xylene.

The thermosetting adhesive, which may be used herein, may contain one or more additives in addition to those mentioned above, without compromising the effect of the present invention. Examples of such additives include fillers, softening agents, stabilizers, adhesion promoters, leveling agents, antifoam agents, plasticizers, tackifying resins, fibers, antioxidants, UV absorbers, hydrolysis inhibitors, thickeners, and colorants such as pigments.

The thermosetting adhesive sheet of the present invention may be manufactured by performing a step of manufacturing the thermosetting adhesive layer, which is carried out by, for example, applying the thermosetting adhesive to the surface of a release liner and drying the adhesive, for example, and a step of pressure-bonding the thermosetting adhesive layer onto one surface or both surfaces of the woven fabric, the nonwoven fabric, or the metal base to transfer the layer thereto.

It is preferable that the pressure-bonding be performed at a pressure of 0.1 MPa to 1.0 MPa. It is preferable that the pressure-bonding be performed in a heated state, at 80° C. to 130° C.

The thermosetting adhesive sheet, which may be used herein, may have a thickness prior to thermosetting preferably in a range of 50 to 350 μm and more preferably of 100 to 350 μm. Preferably, the thermosetting adhesive sheet, which may be used herein, may have a thickness prior to thermosetting of 115 to 300 µm so that, when the sheet is taken up on a roll, the occurrence of cracks, for example, can be inhibited.

The thermosetting adhesive sheet, which may be used herein, may have a thickness after thermosetting preferably in a range of 50 to 350 µm and more preferably of 80 to 300 µm. More preferably, the thermosetting adhesive sheet, which may be used herein, may have a thickness of 100 to 350 µm so that excellent dimensional stability before and after thermosetting can be exhibited, handling can be easy, and rigidity of a level that, without the use of a thick metal reinforcement sheet, which is regarded as a major factor responsible for an increase in thickness of electronic devices and other devices, achieves strong reinforcement of a flexible printed circuit to such a level that detachment of mounted components, for example, is prevented, can be exhibited.

It is preferable that the thermosetting adhesive sheet of the present invention, which may be used herein, have an electrical conductivity in terms of volume resistivity in a range of 0.1 mΩ·cm to 50 mΩ·cm. More preferably, the thermosetting adhesive sheet, which may be used herein, may have a volume resistivity in a range of 0.1 mΩ·cm to 20 mΩ·cm so that, when installing the reinforcement-part-equipped flexible printed circuit, which will be described later, to an electronic device, a metal panel can be electrically connected to the ground traces, which are a constituent of the reinforcement-part-equipped flexible printed circuit, via a cushioning material such as an electrically conductive sponge, and as a result, noise coming from the electronic device can be effectively inhibited. The volume resistivity of the thermoset product of the thermosetting adhesive sheet may be the same as or different from the volume resistivity prior to thermosetting, but it is more preferable that the volume resistivity of the thermoset product may also be within the preferable range described above so that, when installing the reinforcement-part-equipped flexible printed circuit to an electronic device, a metal panel can be electrically connected to the ground traces, which are a constituent of the reinforcement-part-equipped flexible printed circuit, via a cushioning material such as an electrically conductive sponge, and as a result, noise coming from the electronic device can be effectively inhibited.

The volume resistivity is a value measured by using a resistivity meter, Loresta-GP MCP-T600 (manufactured by Mitsubishi Chemical Corporation).

The thermosetting adhesive sheet, before being used, may be held on a release liner.

Examples of the release liner, which may be used herein, include: paper, such as Kraft paper, Glassine paper, and high-quality paper; resin films, such as popolyethylene films, polypropylene films (OPP, CPP), and polyethylene terephthalate films; laminated paper including a laminate of the paper and the resin film; and liners obtained by subjecting the paper to permeation prevention by using, for example, clay and polyvinyl alcohol and performing a release treatment on one surface or both surfaces of the paper by using, for example, a silicone-based resin.

Prior to setting, the thermosetting adhesive sheet is relatively soft and thus exhibits excellent step followability toward a bonding target, and, after thermosetting, the thermosetting adhesive sheet is very hard and thus sufficiently reinforces the bonding target. Hence, the thermosetting adhesive sheet can be dedicatedly used as a material for forming reinforcement parts of flexible printed circuits.

In many cases, a flexible printed circuit is used as a reinforcement-part-equipped flexible printed circuit having a structure in which the flexible printed circuit and a reinforcement part are stacked together. In the related art, a stainless steel sheet is used as the reinforcement part, whereas, in the present invention, the thermoset product of the thermosetting adhesive sheet can be used alone as the reinforcement part. Consequently, both a thickness reduction of flexible printed circuits and excellent step followability toward steps due to, for example, openings or the like of the flexible printed circuit are achieved. In addition, warping after thermosetting is inhibited and electrical conductivity sufficient for practical use is retained, even in the case that the thermoset product of the thermosetting adhesive sheet is used alone as the reinforcement part.

It is preferable that the reinforcement part have a tensile modulus (×3) at 25° C. of 3000 MPa or more. More preferably, the reinforcement part may have a tensile modulus (×3) at 25° C. of 4000 to 20000 MPa so that strong reinforcement of a flexible printed circuit can be achieved without the use of, for example, a stainless steel sheet as described above.

The reinforcement part may be obtained by, for example, heating the thermosetting adhesive sheet at a temperature of, preferably, 120° C. or higher, and more preferably, 120 to 200° C., for 5 to 120 minutes and curing the sheet.

Typically, the flexible printed circuit including the reinforcement part is referred to as a reinforcement-part-equipped flexible printed circuit and installed to an electronic device.

The reinforcement-part-equipped flexible printed circuit can be manufactured by performing, for example, step [1] of attaching or applying the thermosetting adhesive sheet to the back surface, opposite to the mounting surface, of a flexible printed circuit and step [2] of heating the thermosetting adhesive sheet to 120° C. or higher and thermally curing the sheet to form the reinforcement part.

Mounting of components to the flexible printed circuit may be performed in advance before step [1], but it is preferable that the mounting be performed after step [1] and step [2] in order to effectively prevent connection failures of the components in the mounting step.

The reinforcement-part-equipped flexible printed circuit is dedicatedly installed to portable electronic devices, such as smartphones, and electronic devices, such as personal computers. It is preferable that a cushioning material be laid, directly or via another layer, on the surface of the reinforcement part of the flexible printed circuit or the reinforcement-part-equipped flexible printed circuit, for installation to electronic devices.

The layer of the cushioning material may be in a state of being bonded by, for example, an adhesive component or may be in a state of simply being in contact.

Examples of the cushioning material include urethane foam, polyethylene foam, and silicon sponge, and it is preferable to use electrically conductive urethane foam.

It is preferable that the cushioning material, which may be used herein, have a thickness of approximately 0.1 mm to 5.0 mm.

Electronic devices having the structure in which the cushioning material is laid effectively inhibits malfunction due to noise.

EXAMPLE

Examples and comparative examples will be described specifically below.

Example 1

A thermosetting resin composition (X-1) was prepared by mixing 200 parts by mass of a solution (30 mass % solids)

of JER-1256 (manufactured by Mitsubishi Chemical Corporation; bisphenol A type epoxy resin; epoxy equivalent weight, 8000 g/eq.) in methyl ethyl ketone, 10 parts by mass of 850-S (manufactured by DIC CORPORATION; bisphenol A type epoxy resin; epoxy equivalent weight, 188 g/eq.), 42.9 parts by mass of a solution (70 mass % solids) of HP-7200HHH (manufactured by DIC CORPORATION; dicyclopentadiene type epoxy resin; epoxy equivalent weight, 285 g/eq.) in methyl ethyl ketone, and 2.0 parts by mass of DICY-7 (manufactured by Mitsubishi Chemical Corporation, dicyandiamide).

Next, an electrically conductive thermosetting adhesive (Y-1) was obtained by adding, as inorganic fillers, 217.3 parts by mass of NI-255 (nickel powder manufactured by INCO Limited; 50% average particle diameter, 21 μm; apparent density, 0.6 g/cm$^3$) per 100 parts by mass of solids of the thermosetting resin included in the thermosetting resin composition (X-1) and 96.8 parts by mass of DAP-316L-HTD (manufactured by Daido Steel Co., Ltd.; stainless steel powder; 50% average particle diameter, 10.7 μm; tap density, 4.1 g/eq.) per 100 parts by mass of solids of the thermosetting resin and stirring the resultant for 10 minutes by using a dispersion stirrer.

Next, the electrically conductive thermosetting adhesive (Y-1) was applied, by using a rod-shaped metal applicator, to the surface of a release liner (polyethylene terephthalate film of 50 μm in thickness with one surface thereof release-treated with a silicone compound), to a thickness after drying of 140 μm.

Next, the application product was placed in a dryer at 85° C. for five minutes and dried. Thus, an electrically conductive thermosetting adhesive layer of 140 μm in thickness was produced.

Next, a thermosetting adhesive sheet (Z-1) including an electrically conductive thermosetting adhesive layer adjacent to one surface of an electrically conductive nonwoven fabric was obtained in the following manner. The electrically conductive thermosetting adhesive layer was attached to one surface of an electrically conductive nonwoven fabric (A) [electrically conductive nonwoven fabric (15 μm in thickness) obtained by subjecting a wet-laid polyester nonwoven fabric, "type A", manufactured by Miki Tokushu Paper MFG. CO., LTD. (basis weight, 10 g/m$^2$; thickness, 15 μm; polyester fiber diameter, 5 μm (average diameter)) to a surface treatment in which electroless copper plating, electrolytic copper plating, and nickel plating were performed in this order], and the resultant was subjected to pressure bonding for five minutes under conditions including a temperature of 120° C. and a pressure of 0.3 MPa.

Example 2

An electrically conductive thermosetting resin composition (Y-2) and a thermosetting adhesive sheet (Z-2) including an electrically conductive thermosetting adhesive layer adjacent to one surface of an electrically conductive nonwoven fabric was obtained by the same method as in Example 1 except for the following differences. The amount of use of the solution (30 mass % solids) of JER-1256 (manufactured by Mitsubishi Chemical Corporation; bisphenol A type epoxy resin) in methyl ethyl ketone was changed from 200 parts by mass to 166.7 parts by mass. Instead of 850-S (manufactured by DIC CORPORATION; bisphenol A type epoxy resin; epoxy equivalent weight, 188 g/eq.), 10 parts by mass of 830-S (bisphenol F type epoxy resin; epoxy equivalent weight, 170 g/eq.) was used. Instead of the solution (70 mass % solids) of HP-7200HHH (manufactured by DIC CORPORATION; dicyclopentadiene type epoxy resin; epoxy equivalent weight, 285 g/eq.) in methyl ethyl ketone, 50 parts by mass of a solution (80 mass % solids) of TSR-400 (manufactured by DIC CORPORATION; isocyanate-modified bisphenol A type epoxy resin; epoxy equivalent weight, 343 g/eq.) in methyl ethyl ketone was used.

Example 3

An electrically conductive nonwoven fabric (B) was produced by the same method as the manufacturing method for the electrically conductive nonwoven fabric (A) except that, instead of the wet-laid polyester nonwoven fabric, "type A", manufactured by Miki Tokushu Paper MFG. CO., LTD., a wet-laid polyester nonwoven fabric, "Silky Fine WS7A-05-6", manufactured by Asahi Kasei Corp., (basis weight, 6 g/m$^2$; thickness, 18 μm; polyester fiber diameter, 4.5 μm (average diameter)) was used. A thermosetting adhesive sheet (Z-3) including an electrically conductive thermosetting adhesive layer adjacent to one surface of an electrically conductive nonwoven fabric was obtained by the same method as in Example 2.

Example 4

A thermosetting adhesive sheet (Z-4) including an electrically conductive thermosetting adhesive layer adjacent to one surface of a nonwoven fabric was obtained by the same method as in Example 2 except that the wet-laid polyester nonwoven fabric, "type A", manufactured by Miki Tokushu Paper MFG. CO., LTD., was used as it was without being subjected to the surface treatment in which electroless copper plating, electrolytic copper plating, and nickel plating were performed in this order.

Example 5

A thermosetting adhesive sheet (Z-5) including an electrically conductive thermosetting adhesive layer adjacent to one surface of an aluminum foil was obtained by the same method as in Example 1 except that an aluminum foil (12 μm in thickness) was used instead of the electrically conductive nonwoven fabric (A) [electrically conductive nonwoven fabric (15 μm in thickness) obtained by subjecting a wet-laid polyester nonwoven fabric, "type A", manufactured by Miki Tokushu Paper MFG. CO., LTD., to a surface treatment in which electroless copper plating, electrolytic copper plating, and nickel plating were performed in this order].

Example 6

A thermosetting adhesive sheet (Z-6) including an electrically conductive thermosetting adhesive layer adjacent to one surface of an aluminum foil was obtained by the same method as in Example 5 except that an aluminum foil (50 μm in thickness) was used instead of the aluminum foil (12 μm in thickness).

Example 7

A thermosetting adhesive sheet (Z-7) including an electrically conductive thermosetting adhesive layer adjacent to one surface of an aluminum foil was obtained by the same method as in Example 5 except that the electrically conductive thermosetting resin composition (Y-2) was used instead of the electrically conductive thermosetting resin composition (Y-1).

Example 8

A thermosetting adhesive sheet (Z-8) including an electrically conductive thermosetting adhesive layer adjacent to one surface of an aluminum foil was obtained by the same method as in Example 7 except that an aluminum foil (30 μm in thickness) was used instead of the aluminum foil (12 μm in thickness).

Example 9

A thermosetting adhesive sheet (Z-9) including an electrically conductive thermosetting adhesive layer adjacent to one surface of an electrolytic copper foil was obtained by the same method as in Example 7 except that an electrolytic copper foil (8 μm in thickness) was used instead of the aluminum foil (12 μm in thickness).

Example 10

A thermosetting adhesive sheet (Z-10) including an electrically conductive thermosetting adhesive layer adjacent to one surface of an electrolytic copper foil was obtained by the same method as in Example 7 except that an electrolytic copper foil (18 μm in thickness) was used instead of the aluminum foil (12 μm in thickness).

Comparative Example 1

A thermosetting adhesive sheet (Z'-1) formed of an electrically conductive thermosetting adhesive layer was obtained by the same method as in Example 1 except that the electrically conductive nonwoven fabric (A) was not used.

Comparative Example 2

A thermosetting adhesive sheet (Z'-2) formed of an electrically conductive thermosetting adhesive layer was obtained by the same method as in Example 2 except that the electrically conductive nonwoven fabric (A) was not used.

Comparative Example 3

A thermosetting adhesive sheet (Z'-3) of 190 μm in total thickness was obtained by the same method as in Example 2 except that a stainless steel sheet (SUS304) of 50 μm in thickness was used instead of the electrically conductive nonwoven fabric (A).

Comparative Example 4

A thermosetting adhesive sheet (Z'-4) of 190 μm in total thickness was obtained by the same method as in Example 7 except that a polyimide film (non-electrically conductive) of 50 μm in thickness was used instead of the aluminum foil (12 μm in thickness).

[Method for Measuring Tensile Modulus (×1) at 25° C. and Tensile Modulus (×2) at 25° C.]

The electrically conductive thermosetting adhesive layers, each of which was a constituent of the thermosetting adhesive sheet obtained in a corresponding example or comparative example, were cut into pieces measuring 10 mm in width×100 mm in length. The pieces were designated as test specimens 1.

The tensile modulus at 25° C. of test specimen 1 (prior to setting) was measured by using a Tensilon tensile tester under conditions including a tensile speed of 20 mm/min.

Next, test specimen 1 was sandwiched between two pieces of NITFLON (PTFE film manufactured by Nitto Denko Corporation), 0.1 mm in thickness, and the resultant was subjected to a pressure of 2 MPa by using a heat press machine and, in this state, thermally cured at 165° C. for 60 minutes. Thus, test specimen 2 (after thermosetting) was obtained.

The tensile modulus at 25° C. of test specimen 2 (after thermosetting) was measured by using a Tensilon tensile tester under conditions including a tensile speed of 20 mm/min.

[Method 1 for Evaluating Electrical Conductivity (Method for Measuring Volume Resistivity)]

The electrically conductive thermosetting adhesive sheets were each cut into pieces measuring 10 mm in width×100 mm in length. The pieces were designated as test specimens 3.

Next, test specimen 3 was sandwiched between two pieces of NITFLON (PTFE film manufactured by Nitto Denko Corporation), 0.1 mm in thickness, and the resultant was subjected to a pressure of 2 MPa by using a heat press machine and, in this state, thermally cured at 165° C. for 60 minutes. Thus, test specimen 4 (after thermosetting) was obtained.

The volume resistivity of test specimen 5, which was obtained by cutting test specimen 4 (after thermosetting) into pieces measuring 50 mm×80 mm, was measured by a four-probe technique by using a resistivity meter ("Loresta-GP MCP-T600", manufactured by Mitsubishi Chemical Corporation).

[Method for Measuring Reinforcement Performance]

Next, the thermosetting adhesive sheets obtained in Examples and Comparative Examples were each sandwiched between two pieces of PTFE film (manufactured by Nitto Denko Corporation, registered trademark NITFLON), 0.1 mm in thickness, and thereafter was thermally cured at 165° C. for 60 minutes with a pressure of 2 MPa being maintained by a heat press machine. The obtained set products were each cut into pieces measuring 10 mm×70 mm to form a test sample. The sample was placed on two posts, with a space of 70 mm therebetween, and a 0.4 g weight was placed on the center of the test sample. The change in the downward deflection amount at the center of the test sample, between before and after the placement of the weight, was determined by measurement, and the reinforcement performance was evaluated in accordance with the following evaluation criteria.

⊚: The change in the test sample deflection amount was 0 mm or more and less than 6 mm.

○: The change in the test sample deflection amount was 6 mm or more and less than 8 mm.

Δ: The change in the test sample deflection amount was 8 mm or more and less than 10 mm.

x: The change in the test sample deflection amount was 10 mm or more.

[Method for Evaluating Flexibility]

The thermosetting adhesive sheets obtained in Examples and Comparative Examples were each cut into pieces measuring 10 mm×70 mm to form a test sample. The test sample was inserted into a film bending tester provided with a guide rod of 4 mm in core diameter placed therein, and the sample was bent at a speed of 180° per second. Samples that exhibited fractures and/or cracks as a result of bending were given a rating of "x" for flexibility performance. Samples that exhibited no fractures or cracks were given a rating of "○" for flexibility performance.

[Method for Evaluating Warping]

A polyimide film of 125 μm in thickness was attached to each of the thermosetting adhesive sheets obtained in Examples and Comparative Examples, and the resultant was subjected to thermocompression bonding at a temperature of 165° C. and a pressure of 2 MPa for one hour. The obtained thermoset product (square shape, 30 mm in length×30 mm in width) was placed on a level surface. The heights from the level surface to the four corners of the thermoset product (apexes of square) were measured, and the average was designated as the warping amount.

In addition, a polyimide film of 125 μm in thickness was attached to each of the thermosetting adhesive sheets, and the resultant was subjected to thermocompression bonding at a temperature of 165° C. and a pressure of 2 MPa for one hour and then to heating at 260° C. for 150 seconds. The obtained thermoset product (square shape, 30 mm in length× 30 mm in width) was placed on a level surface. The heights from the level surface to the four corners of the thermoset product were measured, and the average was designated as the warping amount.

TABLE 1

|  | Example 1 | Example 2 | Example 3 | Example 4 | Example 5 |
|---|---|---|---|---|---|
| Adhesive sheet | Z-1 | Z-2 | Z-3 | Z-4 | Z-5 |
| Tensile modulus [MPa] of thermosetting adhesive layer before thermosetting | 1,800 | 1,630 | 1,630 | 1,630 | 1,800 |
| Tensile modulus [MPa] of thermosetting adhesive layer after thermosetting | 5,960 | 4,160 | 4,160 | 4,150 | 5,960 |
| Volume resistivity [mΩ · cm] | 0.49 | 0.01 | 0.01 | 0.7 | 0.4 |
| Reinforcement performance | ⊙ | ⊙ | ⊙ | ⊙ | ⊙ |
| Flexibility performance | ○ | ○ | ○ | ○ | ○ |
| Warping amount after thermocompression bonding at 165° C. | 3.3 | 2 | 2.2 | 2.6 | 1.5 |
| Warping amount after heating at 260° C. | 3.5 | 3.9 | 4.1 | 4 | 1 |

TABLE 2

|  | Example 6 | Example 7 | Example 8 | Example 9 | Example 10 |
|---|---|---|---|---|---|
| Adhesive sheet | Z-6 | Z-7 | Z-8 | Z-9 | Z-10 |
| Tensile modulus [MPa] of thermosetting adhesive layer before thermosetting | 1,800 | 1,630 | 1,630 | 1,630 | 1,630 |
| Tensile modulus [MPa] of thermosetting adhesive layer after thermosetting | 5,960 | 4,160 | 4,160 | 4,160 | 4,160 |
| Volume resistivity [mΩ · cm] | 0.5 | 0.01 | 0.01 | 0.01 | 0.01 |
| Reinforcement performance | ⊙ | ⊙ | ⊙ | ⊙ | ⊙ |
| Flexibility performance | ○ | ○ | ○ | ○ | ○ |
| Warping amount after thermocompression bonding at 165° C. | 0.6 | 1.3 | 1.1 | −0.5 | −1.3 |
| Warping amount after heating at 260° C. | 0 | 1.1 | 1 | 1.3 | −1.5 |

TABLE 3

|  | Comparative Example 1 | Comparative Example 2 | Comparative Example 3 | Comparative Example 4 |
|---|---|---|---|---|
| Adhesive sheet | Z'-1 | Z'-2 | Z'-3 | Z'-6 |
| Tensile modulus [MPa] of thermosetting adhesive layer before thermosetting | 1,800 | 1,630 | 1,630 | 1,630 |
| Tensile modulus [MPa] of thermosetting adhesive layer after thermosetting | 5,960 | 4,160 | 4,160 | 4,160 |
| Volume resistivity [mΩ · cm] | 12 | 0.05 | 0.01 | >$10^7$ |
| Reinforcement performance | ⊙ | ⊙ | ⊙ | ⊙ |
| Flexibility performance | ○ | ○ | X | ○ |
| Warping amount after thermocompression bonding at 165° C. | 6.4 | 4.6 | 0.5 | −0.1 |
| Warping amount after heating at 260° C. | 8.4 | 6.1 | 1.2 | −0.4 |

The invention claimed is:

1. A thermosetting adhesive sheet configured to be used to reinforce a flexible printed circuit, the thermosetting adhesive sheet comprising:
    a woven fabric, a nonwoven fabric, or a metal base of 50 μm or less thickness; and
    a thermosetting adhesive layer adjacent to at least one surface of the woven fabric, the nonwoven fabric, or the metal base of 50 μm or less thickness,
    wherein the thermosetting adhesive layer has a tensile modulus (×1) at 25° C. in a range of 5 MPa to 2500 MPa, and a thermoset product of the thermosetting adhesive sheet has a tensile modulus (×2) at 25° C. of 2500 MPa or more.

2. The thermosetting adhesive sheet according to claim 1, wherein the thermosetting adhesive sheet has a thickness in a range of 50 μm to 350 μm.

3. The thermosetting adhesive sheet according to claim 1, wherein the woven fabric is an electrically conductive woven fabric or the nonwoven fabric is an electrically conductive nonwoven fabric, and the woven fabric or the nonwoven fabric has a thickness in a range of 10 μm to 50 μm.

4. The thermosetting adhesive sheet according to claim 1, wherein the metal base of 50 μm or less thickness is an aluminum base.

5. The thermosetting adhesive sheet according to claim 1, wherein the thermosetting adhesive layer includes a thermosetting resin and an electrically conductive filler.

6. A method for manufacturing a reinforcement-part-equipped flexible printed circuit, the method comprising the steps of:

[1] attaching the thermosetting adhesive sheet according to claim 1 to a back surface, opposite to a mounting surface, of a flexible printed circuit; and

[2] forming a reinforcement part by heating the thermosetting adhesive sheet to 120° C. or higher to thermally cure the thermosetting adhesive sheet, the reinforcement part comprising a thermoset product of the thermosetting adhesive sheet.

7. An electronic device comprising a structure including:

the reinforcement-part-equipped flexible printed circuit according to claim 6; and a cushioning material laid, directly or via another layer, on a surface of the reinforcement part of the reinforcement-part-equipped flexible printed circuit.

8. The thermosetting adhesive sheet according to claim 1, wherein the thermosetting adhesive layer includes a thermosetting epoxy resin having a total epoxy equivalent weight in a range of 300 g/eq. to 2000 g/eq.

9. The thermosetting adhesive sheet according to claim 1, further comprising a release liner on the thermosetting adhesive layer, which can be removable before forming the thermoset product of the thermosetting adhesive sheet.

* * * * *